United States Patent
Miyahara et al.

(10) Patent No.: US 8,343,275 B2
(45) Date of Patent: Jan. 1, 2013

(54) SINGLE CRYSTAL GROWTH METHOD AND SINGLE CRYSTAL PULLING APPARATUS FOR IMPROVING YIELD AND PRODUCTIVITY OF SINGLE CRYSTAL

(75) Inventors: Yuuichi Miyahara, Echizen (JP); Atsushi Iwasaki, Echizen (JP); Tetsuhiro Oda, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 579 days.

(21) Appl. No.: 12/449,878

(22) PCT Filed: Feb. 28, 2008

(86) PCT No.: PCT/JP2008/000381
§ 371 (c)(1),
(2), (4) Date: Sep. 1, 2009

(87) PCT Pub. No.: WO2008/120435
PCT Pub. Date: Oct. 9, 2008

(65) Prior Publication Data
US 2010/0126408 A1 May 27, 2010

(30) Foreign Application Priority Data
Apr. 3, 2007 (JP) .................................. 2007-097096

(51) Int. Cl.
*C30B 15/22* (2006.01)
(52) U.S. Cl. ................ 117/14; 117/13; 117/15; 117/35; 117/36; 117/206; 117/208
(58) Field of Classification Search ............... 117/13–15, 117/35–36, 206, 208, 931–932
See application file for complete search history.

(56) References Cited

U.S. PATENT DOCUMENTS

| | | | | |
|---|---|---|---|---|
| 3,086,857 | A | * | 4/1963 | Pfann ................................ 117/29 |
| 4,330,359 | A | * | 5/1982 | Lovelace et al. ................. 117/26 |
| 6,228,165 | B1 | * | 5/2001 | Baba et al. ....................... 117/29 |
| 2003/0159646 | A1 | * | 8/2003 | Watanabe ......................... 117/18 |

FOREIGN PATENT DOCUMENTS

| | | |
|---|---|---|
| JP | A-62-275087 | 11/1987 |
| JP | A-6-107492 | 4/1994 |
| JP | A-2003-505335 | 2/2003 |
| JP | A-2006-36568 | 2/2006 |
| WO | WO 01/09411 A1 | 2/2001 |

OTHER PUBLICATIONS

Shimura: "Semiconductor Silicon Crystal Engineering;" *RCCZ Method*, Maruzen Co.; 1993; pp. 72-73.

* cited by examiner

*Primary Examiner* — Michael Kornakov
*Assistant Examiner* — Kenneth A Bratland, Jr.
(74) *Attorney, Agent, or Firm* — Oliff & Berridge, PLC

(57) ABSTRACT

The present invention resides in a silicon single crystal growth method of pulling up and growing a single crystal from a melt of a silicon raw material in a quartz crucible based on a Czochralski method, wherein the method comprises the steps of: applying a DC voltage between an outer wall of the quartz crucible acts as a positive electrode and a pulling wire or pulling shaft for pulling up the silicon single crystal acts as a negative electrode; and fixing an electric current flowing through the silicon single crystal over a period of time for pulling up the single crystal, to grow the single crystal; as well as a pulling apparatus therefor.

4 Claims, 5 Drawing Sheets

SINGLE CRYSTAL GROWTH METHOD AND SINGLE CRYSTAL PULLING APPARATUS FOR IMPROVING YIELD AND PRODUCTIVITY OF SINGLE CRYSTAL

TECHNICAL FIELD

The present invention relates to a silicon single crystal growth method and a single crystal pulling apparatus to be used therefor, and more particularly to a silicon single crystal growth method and a pulling apparatus therefor capable of improving a yield and productivity of single crystal.

BACKGROUND ART

Various methods are known for producing silicon single crystals to be used for semiconductor substrates, and examples thereof include a Czochralski method (hereinafter called "CZ method") which is widely used as a rotat inn pulling method.

FIG. 5 is a schematic view of an essential constitution of a pulling apparatus adapted to perform a silicon single crystal growth method based on the CZ method.

The pulling apparatus has an external appearance constituted of a chamber (not shown), and a crucible is disposed at the center of the apparatus. The crucible has a double structure which is constituted of an inner holding vessel (hereinafter simply called "quartz crucible 11a") made of quartz and having a bottomed cylindrical shape, and an outer holding vessel (hereinafter simply called "graphite crucible 11b") made of graphite and having a bottomed cylindrical shape adapted to hold an outer surface of the quartz crucible 11a.

These crucibles are fixed to an upper end of a support shaft 16 to allow the crucibles rotating/elevating movement. Further, a resistance heater 12 is disposed outside crucibles and substantially concentrically with the crucibles, and a silicon raw material of a predetermined weight delivered into the crucible is melted by the heater 12 to form a melt 13.

A pulling wire 15 (or pulling shaft, and these may be called a "pulling member") configured to rotate about the same axis with the support shaft 16 at a predetermined speed and in a direction which is the same as or opposite to that of the support shaft, is disposed above a central axis of the crucible filled with the melt 13, and a seed crystal 17 is held at a lower end of the pulling member 15.

In such a pulling apparatus, a silicon raw material is delivered into the quartz crucible, and the silicon raw material is melted by the heater disposed around the crucible in an inert gas atmosphere under reduced pressure, followed by immersion of the seed crystal held at the lower end of the pulling member into an upper surface of the formed melt, and followed by elevation of the pulling member while rotating the crucible and the pulling member, to grow a crystal from a lower end surface of the seed crystal.

In the CZ method, in order to eliminate dislocations inherently included in a seed crystal as well as dislocations to be brought about by thermal shock upon contact with the melt, after a necking process for constricting a crystal growing from the lower end surface of the seed crystal into a diameter of about 3 mm, a shoulder to be grown into a body (constant diameter portion) having a predetermined diameter is formed, and a silicon single crystal 14 is subsequently grown at a predetermined diameter. During it, the quartz crucible is rotated in the seed crystal, the same direction or opposite directions. Upon achievement of a targeted length of the single crystal, a constricting operation of a tail of the single crystal is conducted, thereby completing the growth of the single crystal.

As described above, in case of pulling up a silicon single crystal according to the CZ method, the melt obtained by melting the silicon raw material is held in the quartz crucible of the crucible having the double structure. When the quartz crucible holds the silicon melt, the quartz crucible surface is subjected to a high-temperature at 1,500° C. or higher, and the subjected time typically comes up to several tens of hours or longer, though such a time varies depending on conditions such as a filled amount of silicon raw material, a crystal growth rate, and the like.

Further, in order to enhance a single-crystal pulling up productivity, a recharge pulling method (RCCZ method; see "Semiconductor silicon crystal engineering", pp. 72-73, Fumio Shimura, MARUZEN Co., Ltd., for example) configured to produce a plurality of single crystals from a same crucible has been recently developed. In such a recharge pulling method, a time, during which the quartz crucible is subjected to a silicon melt, may exceed 100 hours.

Typically, brown cristobalite called "brownish ring" is formed at an inner wall surface of the quartz crucible during contact of the quartz crucible with a silicon melt in a high-temperature state, and brownish rings are caused to gradually grow. When such brownish rings are separated from the quartz crucible during a pulling process of the single crystal, the brownish rings obstruct growth of the crystal, to thereby generating dislocations in the crystal.

To prevent such dislocations to be caused by degradation of an inner surface of a crucible, a method for generating devitrification (crystallization) at an inner wall surface of a quartz crucible, by causing the quartz crucible to include one kind or two or more kinds of alkali metal ions of Na, K, and Li, and by applying a DC voltage of a constant value between the quartz crucible and the seed crystal such that an outer wall side of the quartz crucible acts as a positive electrode, and the seed crystal side (silicon single crystal side) acts as a negative electrode, has been disclosed (see JP2006-36568A, for example).

However, even adoption of the above method has sometimes failed to generate a sufficient degree of devitrification at a crucible surface, so that the method is insufficient for prevention of occurrence of dislocations in a silicon single crystal. Further, such a problem that, when a thermal oxidation treatment is conducted for wafers sliced out of the obtained single crystal, extensive variances are caused in thicknesses of oxide films to be formed on surfaces of the wafers, is left.

DISCLOSURE OF INVENTION

The present invention aims at providing a silicon single crystal growth method and a pulling apparatus therefor, capable of generating appropriately crystallized layers, i.e., devitrification at an inner wall surface of a quartz crucible during a silicon single crystal growth process, and capable of simultaneously controlling a Li concentration of the silicon single crystal, so as to prevent generating dislocations in the single crystal growth process, thereby improving a yield and productivity of single crystal, while simultaneously restricting variances of thicknesses of those oxide films of sliced wafers which oxide films are to be formed by subsequent thermal oxidation treatments.

To solve the above problem, the present invention provides a silicon single crystal growth method of pulling up and growing a single crystal from a melt of a silicon raw material in a quartz crucible based on a Czochralski method, wherein the method comprises the steps of:

applying a DC voltage between an outer wall of the quartz crucible acts as a positive electrode and a pulling wire or pulling shaft for pulling up the silicon single crystal acts as a negative electrode; and fixing an electric current flowing through the silicon single crystal over a period of time for pulling up the single crystal, to grow the single crystal.

In this way, by fixing the electric current flowing through a silicon single crystal over a period of time for pulling up the single crystal, appropriate devitrification can be generated at an inner wall surface of the quartz crucible to prevent generating dislocations in the single crystal growth process to thereby improve a yield and productivity of single crystal, and an amount of alkali metal ions to be caught into the single crystal during growth can be uniformalized to thereby restrict variances of thicknesses of those oxide films of sliced wafers which oxide films are to be formed by subsequent thermal oxidation treatments.

In the growth method of the present invention, the quartz crucible is preferably constituted of an outer wall made of natural quartz containing alkali metal ions, and an inner wall made of synthetic quartz having an alkali metal ion content lower than that of the natural quartz.

This allows for further improvement of the above effect, particularly a Li concentration of a silicon single crystal can be decreased.

Further, in the growth method of the present invention, the electric current flowing through the silicon single crystal is preferably kept within a range between 0.1 mA and 15 mA.

When the applicable electric current is selected within such a range of electric current in accordance with an alkali metal ion concentration of the adopted quartz crucible, it becomes possible to control a Li concentration of a silicon single crystal to be uniform and low while generating an appropriate degree of devitrification.

Furthermore, in the growth method of the present invention, the step of fixing the electric current preferably comprises a step of setting the electric current at a constant value for providing a devitrification area ratio Vc/Vi of 20% or more during pulling-up of the single crystal, to thereby grow the single crystal silicon, where Vc is an area devitrified at an inner wall surface of the quartz crucible, and Vi is an area which the inner wall surface of the quartz crucible contacts with the melt upon initiation of pulling-up of the single crystal.

This allows for more reliable restriction of generating dislocations in the crystal.

The present invention further provides a silicon single crystal pulling apparatus for pulling up and growing a single crystal from a melt of a silicon raw material in a quartz crucible based on a Czochralski method, wherein the apparatus comprises: a constant-current device connected to: a pulling wire or pulling shaft for pulling up at least a seed crystal, which seed crystal is to be immersed into the melt and pulled up while growing the single crystal at a lower end surface of the seed crystal; and an outer wall of the quartz crucible; in a manner capable of applying a voltage between the pulling wire or pulling shaft and the quartz crucible outer wall, to control a DC voltage so as to fix an electric current flowing between the seed crystal and the quartz crucible outer wall; and that the DC voltage is applied between the quartz crucible outer wall and the seed crystal so that the quartz crucible outer wall side acts as a positive electrode.

By providing such a constant-current device so as to be able to fix the electric current flowing through a silicon single crystal over a period of time for pulling up the single crystal, appropriate devitrification can be generated at an inner wall surface of the quartz crucible to prevent generating dislocations in the single crystal growth process to thereby improve a yield and productivity of single crystal, and it becomes possible to restrict variances of thicknesses of those oxide films of sliced wafers which oxide films are to be formed by subsequent thermal oxidation treatments.

Further, the quartz crucible is preferably constituted of an outer wall made of natural quartz containing alkali metal ions, and an inner wall made of synthetic quartz having an alkali metal ion content lower than that of the natural quartz.

This enables generation of an appropriate degree of devitrification, and a low and constant Li concentration of the silicon single crystal.

Furthermore, in the present invention, the constant-current device is preferably configured to control the electric current flowing between the seed crystal and the quartz crucible outer wall to be a constant current within a range between 0.1 mA and 15 mA.

When the applicable electric current is controlled to be selected within such a range of electric current in accordance with an alkali metal ion concentration of the quartz crucible, it becomes possible to control a Li concentration of a silicon single crystal to be uniform and low while generating an appropriate degree of devitrification.

As described above, in the present invention, upon growing a silicon single crystal, a DC voltage is applied between an outer wall of the quartz crucible acts as a positive electrode and a pulling wire or pulling shaft for pulling up the silicon single crystal acts as a negative electrode; and an electric current flowing through the silicon single crystal over a period of time for pulling up the single crystal, is fixed to grow the silicon single crystal. This enables to: efficiently devitrify an inner wall surface of the quartz crucible to thereby prevent generating dislocations in the single crystal growth process to improve a yield and productivity of single crystal; and control the Li concentration of the silicon single crystal to be uniform, thereby restricting variances of oxide film thicknesses upon thermal oxidation of wafers sliced out of the silicon single crystal.

BEST MODE(S) FOR CARRYING OUT THE INVENTION

Figure 1:
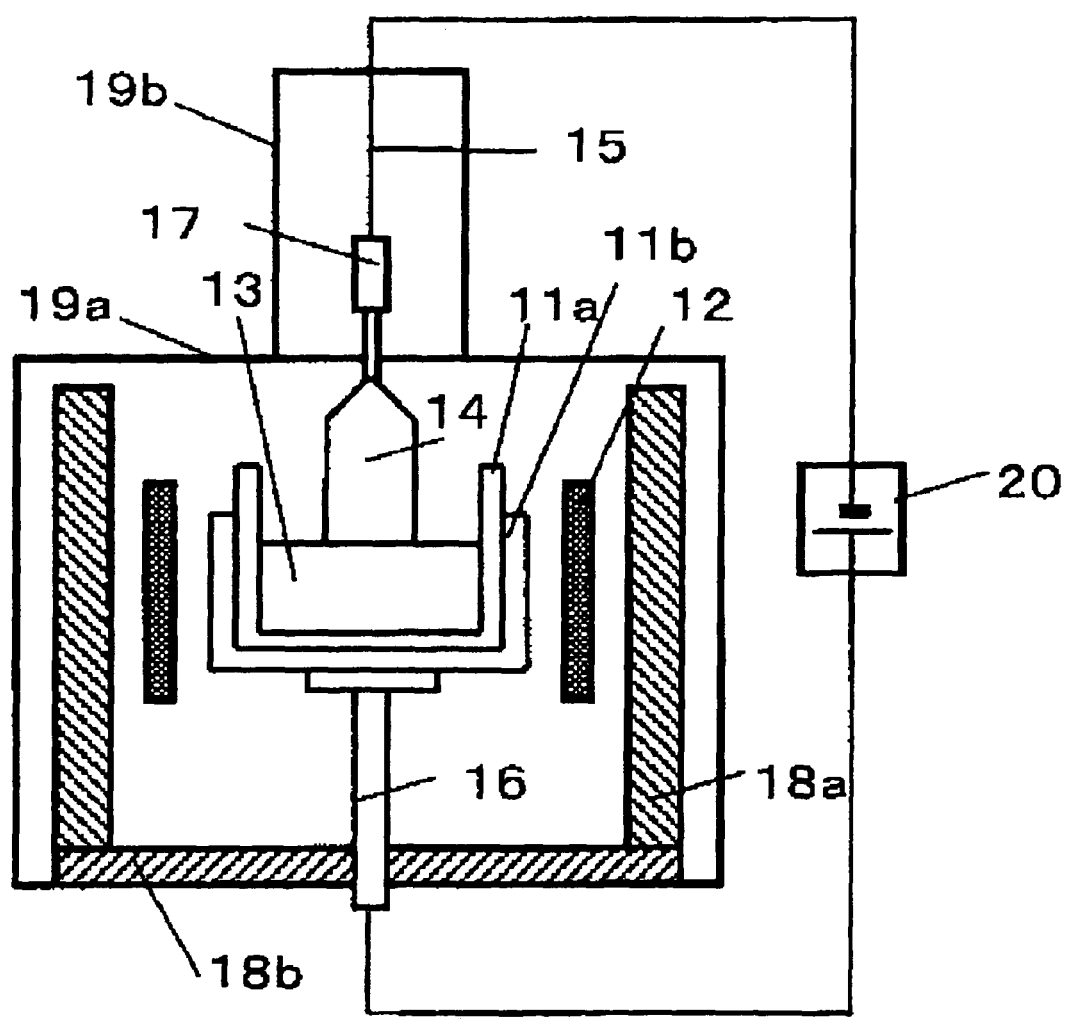
FIG. 1 is a schematic view of an exemplary cross-sectional configuration of a silicon single crystal pulling apparatus according to the present invention.

The present invention will be explained more concretely hereinafter.

Although the method for generating devitrification at an inner wall surface of a quartz crucible, by causing the quartz crucible to include one kind or two or more kinds of alkali metal of Na, K, and Li, and by applying a DC voltage between the quartz crucible and a seed crystal such that an outer wall side of the quartz crucible acts as a positive electrode, and the seed crystal side (silicon single crystal side) acts as a negative electrode, thereby preventing such generating dislocations to be caused by crystallization of an inner surface of a crucible, has been disclosed as described above; such a method has been insufficient for prevention of generating dislocations. Thus, the present inventors have firstly endeavored to find out the reason thereof.

In the conventional method configured to adopt applying DC voltage of a constant value, it has been then recognized that a contact area between a melt of silicon raw material and a quartz crucible is decreased with progression of pulling-up of a silicon single crystal, so that a circuit resistance between the silicon single crystal and an outer wall of the quartz crucible is increased and an electric current flowing through the silicon single crystal is gradually decreased.

However, in order to devitrify an inner wall surface of a quartz crucible, it is required to cause a flow of electric current equal to or more than a certain value.

This requires applying a DC voltage equal to or more than a certain value, for devitrification of an inner wall surface of the quartz crucible.

However, it has been recognized that, when an electric current flows between a silicon single crystal and an outer wall of a quartz crucible, Li contained in the quartz crucible is caused to diffuse a melt side and is caught into the silicon single crystal through the melt. It also has been recognized that larger amounts of Li are caught into silicon single crystals are caused by larger electric currents.

Further, it has been recognized that wafers sliced out of silicon single crystals, which Li is caught, a growth rate of oxide film by a thermal oxidation treatment becomes increased, and larger growth rates are caused by higher Li concentrations in single crystals. Thus, it has been recognized that non-uniform Li concentrations in silicon single crystals lead to variances of Li concentrations in wafers sliced out of the silicon single crystals, thereby inevitably causing a problem of fluctuated oxide film thicknesses of wafers.

Thus, it is required to restrict a Li concentration of a silicon single crystal to be equal to or less than a certain value in order to decrease variances of oxide film thicknesses of wafers, but it is then required to decrease an electric current flowing through the silicon single crystal, thereby requiring to decrease a DC voltage to be applied.

However, it has been then recognized that decreased DC voltages to be applied rather lead to difficulty of devitrification at an inner wall surface of a quartz crucible, thereby failing to obtain a generating dislocation restricting effect by virtue of prevention of corrosion or degradation of the inner wall surface, to thereby fail to improve a yield and productivity of single crystal.

Thus, the present inventors have detailedly investigated a silicon single crystal pulling process with applying DC voltage, about a state of devitrification at an inner wall surface of a quartz crucible, and about a Li concentration of a silicon single crystal and oxide film thicknesses of wafers subsequently sliced out of the single crystal then.

As a result, it has been discovered that an electric current flowing through a single crystal is decreased with progression of pulling-up of the silicon single crystal (in other words, with decrease of a contact area between a melt and a quartz crucible), and a Li concentration of the silicon single crystal is also decreased in a pulled-up direction.

Further, it has been discovered that higher Li concentrations of wafers sliced out of a silicon single crystal result in larger oxide film thicknesses upon thermal oxidation, and that restriction of Li concentrations to be equal to or less than a certain value enables oxide film thicknesses to be equivalent to those of wafers sliced out of a silicon single crystal pulled up by a conventional method without applying DC voltage.

In turn, an investigation of electric currents required to effectively devitrify an inner wall surface of a quartz crucible has been conducted, to find out a presence of an electric current range capable of simultaneously allowing for a Li concentration which does not affect oxide film thicknesses of wafers, and for efficient devitrification of an inner wall surface of a quartz crucible.

Then, it has been recognized that, by controlling an electric current during pulling-up of a silicon single crystal to be kept constant at the above-mentioned electric current, a uniform Li concentration can be obtained over a whole region of the silicon single crystal in a pulled-up direction.

Further, it has been recognized that, in case of adoption of a quartz crucible having an outer wall containing a small amount of alkali metal ions, and an inner wall containing alkali metal ions in an amount smaller than that of the outer wall, obtainment of a uniform Li concentration in a pulled-up direction can be facilitated in a manner to effectively devitrify the inner wall surface of the quartz crucible while restricting a Li concentration of the silicon single crystal.

The present invention has been completed based on the above-described discoveries and recognitions, and the present invention will be described in more detail with reference to the accompanying drawings, however the present invention is not limited thereto.

FIG. 1 is a schematic view of an exemplary cross-sectional configuration of a silicon single crystal pulling apparatus according to the present invention. The pulling apparatus to be used for a silicon single crystal growth method of the present invention is described as follows.

The pulling apparatus has an external appearance constituted of a chamber in a hollow cylinder shape, and the chamber is constituted of a main chamber 19a acting as a lower cylinder, and a pull chamber 19b joined and fixed to the main chamber 19a and acting as an upper cylinder, and the pulling apparatus is provided with a crucible at the center of the chamber. The crucible has a double structure which is constituted of an inner holding vessel (hereinafter simply called "quartz crucible 11a") made of quartz and having a bottomed cylindrical shape, and an outer holding vessel (hereinafter simply called "graphite crucible 11b") made of graphite and having a bottomed cylindrical shape adapted to hold an outer surface of the quartz crucible 11a.

A heater 12 is disposed outside the crucible having the double structure, a heat insulating cylinder 18a is disposed around an outer periphery of the heater 12 in a manner concentric therewith, and a heat insulating plate 18b is disposed under the heat insulating cylinder, at the bottom of the apparatus. Further, the apparatus includes a DC power supply 20 installed to apply a DC voltage for causing a constant DC current between a seed crystal 17 held at an end of a pulling member 15 and the crucible supported by a support shaft 16.

Further, a silicon raw material of a predetermined weight is delivered into the crucible, and the silicon raw material is melted to form a melt 13. The seed crystal 17 is immersed into a surface of the formed melt 13, and then the pulling member 15 is pulled up while rotating the crucible and the pulling member 15, to thereby grow a silicon single crystal 14 from a lower end surface of the seed crystal 17.

In this way, by using a constant-current device to fix an electric current flowing through a silicon single crystal over a period of time for pulling up the single crystal, appropriate devitrification can be generated at an inner wall surface of the quartz crucible to prevent generating dislocations in the single crystal growth process to thereby improve a yield and productivity of single crystal, and a concentration of Li to be caught into the single crystal can be uniformalized to thereby restrict variances of thicknesses of those oxide films of sliced wafers which oxide films are to be formed by subsequent thermal oxidation treatments.

Further, in this case, it is possible to use, as the quartz crucible, one which is constituted of an outer wall made of natural quartz containing alkali metal ions, and an inner wall made of synthetic quartz having an alkali metal ion content lower than that of the natural quartz.

This allows to decrease a concentration of alkali metal ions contained in the whole of the quartz crucible, thereby enabling achievement of a low and constant Li concentration of the silicon single crystal. Thus, it becomes possible to obtain an appropriate degree of devitrification and uniform characteristics.

The alkali metal ions in the natural quartz refer to one kind or two or more kinds of Na, K, and Li, and the total content of alkali metal ions of the synthetic quartz is preferably within a range of 0.01 ppm to 10 ppm, and more preferably 0.01 ppm to 5 ppm.

Further, the constant-current device is capable of controlling an electric current flowing between the seed crystal and the quartz crucible to be a constant current within a range between 0.1 mA and 15 mA, preferably a range between 0.1 mA and 3 mA.

When the applicable electric current is controlled to be selected within such a range of electric current in accordance with an alkali metal ion concentration of the quartz crucible, it becomes possible to control a Li concentration of a silicon single crystal to be uniform and low while generating an appropriate degree of devitrification.

An example of a silicon single crystal growth method of the present invention will be described hereinafter, the present invention is not limited thereto.

In a single crystal growth method of pulling up and growing a silicon single crystal from a melt of a silicon raw material in a quartz crucible based on a Czochralski method, the method comprises the steps of:

upon pulling and growing the silicon single crystal, applying a DC voltage between an outer wall of the quartz crucible acts as a positive electrode and a pulling wire or pulling shaft for pulling up the single crystal acts as a negative electrode; and fixing an electric current flowing through the silicon single crystal over a period of time for pulling up the single crystal, to grow the silicon single crystal.

Such a growth method of the present invention can be implemented by the above-described apparatus, for example.

By utilizing the constant-current device to fix an electric current flowing through a silicon single crystal over a period of time for pulling up the single crystal in the above manner, it becomes possible to assuredly flow an electric current of a predetermined value through the single crystal even when the circuit resistance is varied due to a change of a contact area of the melt with the quartz crucible and/or even when the alkali metal ion concentration of the used quartz crucible is varied, thereby enabling to diffuse alkali metal ions to the inner wall surface of the quartz crucible to thereby generate an appropriate degree of devitrification. This allows to prevent generating dislocations in a single crystal growth process, thereby improving a yield and productivity of single crystal. Further, the constant current allows for a fixed concentration of alkali metal to be caught into a single crystal, thereby restricting variances of thicknesses of those oxide films of sliced wafers which oxide films are to be formed by subsequent thermal oxidation treatments.

In this case, the quartz crucible may be constituted of an outer wall made of natural quartz containing alkali metal ions, and an inner wall made of synthetic quartz having an alkali metal ion content lower than that of the natural quartz.

This allows for achievement of an appropriate degree of devitrification, and a uniform and low concentration of Li in the silicon single crystal, as described above.

Further, the electric current flowing through the silicon single crystal can be kept within a range between 0.1 mA and 15 mA.

In this way, when the electric current to be flowed through the silicon single crystal is selected within the above range in accordance with an alkali metal ion concentration of the quartz crucible, it becomes possible to control a Li concentration of a silicon single crystal to be uniform and low while generating an appropriate degree of devitrification at an inner wall of the quartz crucible.

In this case, the electric current to be selected is preferably set at a constant value for providing a devitrification area ratio Vc/Vi of 20% or more during pulling-up of the silicon single crystal, to thereby grow the single crystal silicon, where Vc is an area devitrified at an inner wall surface of the quartz crucible, and Vi is an area which the inner wall surface of the quartz crucible contacts with the melt at an initial stage of melting.

This allows for prevent generating dislocations in a single crystal, more assuredly.

The present invention will be described more concretely with reference to Example of the present invention and Comparative Examples, the present invention is not limited thereto.

EXAMPLE

The pulling apparatus shown in FIG. 1 was used to fill 70 kg of silicon raw material into the quartz crucible having an inner diameter of 450 mm, and to form a melt, followed by pulling-up of a silicon single crystal having a diameter of 150 mm, and thereby, the single crystal was grown. Pulling-up of the silicon single crystal was conducted in a manner to: use the quartz crucible having a Li content of 0.5 ppm; apply a DC voltage so that an outer wall side of the quartz crucible acted as a positive electrode; and fix an electric current to be flowed between the seed crystal and the quartz crucible outer wall, at 0.5 mA over a whole process of pulling up the silicon single crystal.

Thereafter, single crystal yields; devitrification area ratios at the quartz crucible inner wall; Li concentrations of the silicon single crystals; and oxide film thicknesses of those wafers after thermal oxidation, which were sliced out of shoulder portions, central portions, and tail portions of the silicon single crystals, respectively; were measured for three batches, respectively.

Here, the process flow to measure the Li concentrations will be described below. Namely, the obtained silicon single crystal ingots were sliced into wafers, followed by performing etching (CW), polishing (PW), and the like. Since Li in each wafer was caused to diffuse an oxide film and to be trapped therein upon conduction of a thermal oxidation treatment, an oxidation treatment was subsequently conducted by a heat treatment furnace at 900° C. for 10 minutes to form an oxide film on each wafer, followed by a final measurement of Li concentrations of the oxide films of wafers, by ICP-MS.

COMPARATIVE EXAMPLE 1

In the silicon single crystal growth method for above-described Example, silicon single crystals, each grown under a condition that no electric currents were flowed by an electric potential difference of 0 V between the seed crystal and the quartz crucible outer wall, were also evaluated in the same manner as Example.

COMPARATIVE EXAMPLE 2

Figure 6:
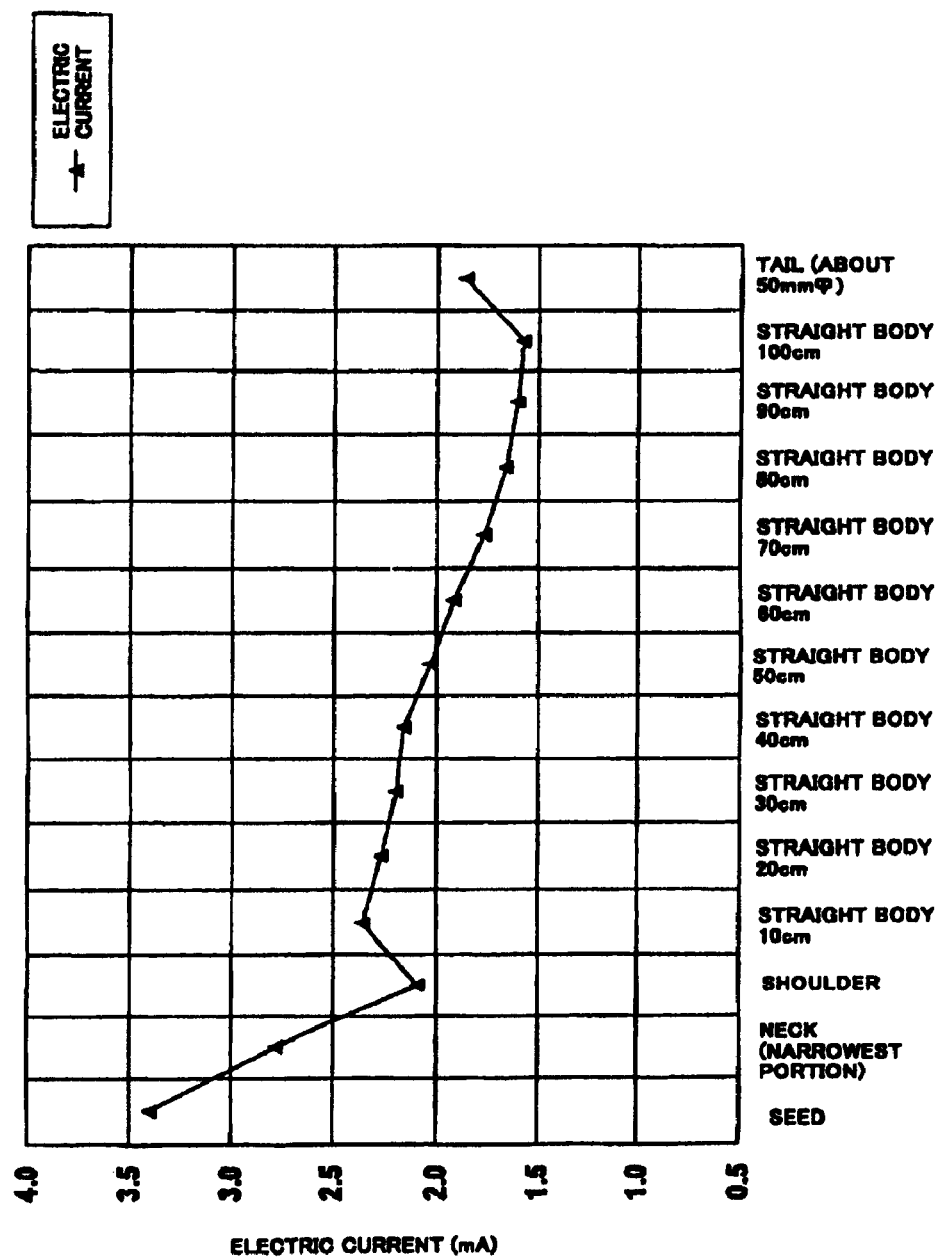
FIG. 6 is a graph which shows a fluctuating state of an electric current over respective steps at a voltage of 12V in Comparative Example 2.

Further, in the silicon single crystal growth method for above-described Example, silicon single crystals, each pulled up and grown under a condition of a fixed electric potential difference of 12 V between the seed crystal and the quartz crucible outer wall (note that the electric current was fluctuated during a growing process of the silicon single crystal as shown in FIG. 6), were also evaluated in the manner as Example and Comparative Example 1.

Figure 3:
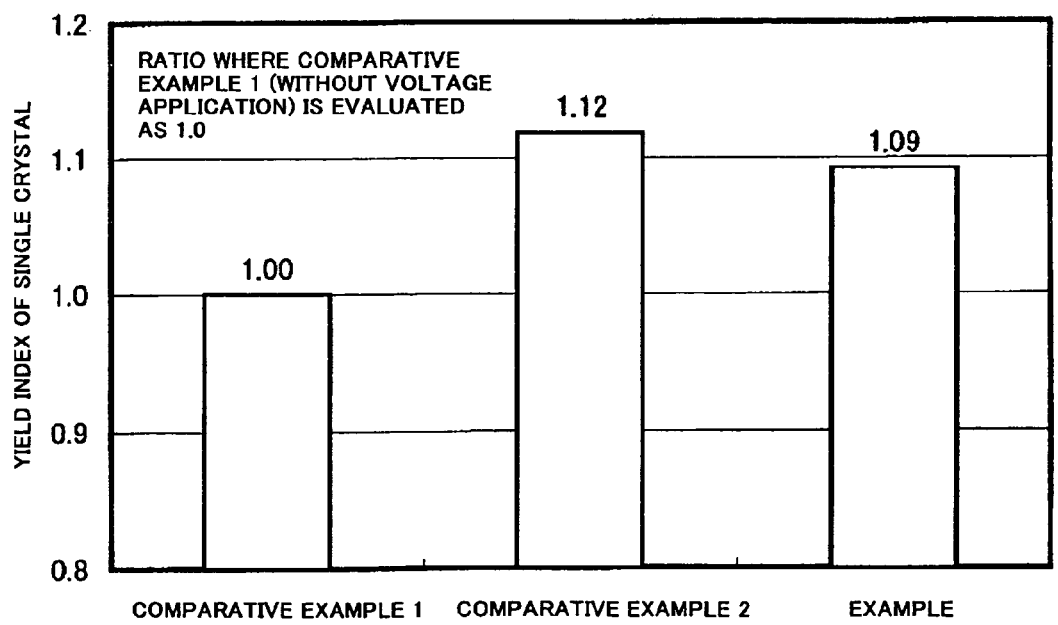
FIG. 3 is a graph of a single crystal yield of Example and Comparative Examples.

FIG. 3 is a graph of a single crystal yield of Example and Comparative Examples 1 and 2.

In Example, it was possible to ensure a yield higher than that of Comparative Example 1. Also, Comparative Example 2 exhibited a yield higher than that of Comparative Example 1.

The devitrification area ratio of Example at the quartz crucible inner wall was caused to be 20 to 30%, thereby enabling obtainment of a sufficient degree of devitrification for restricting generating dislocations in the silicon single crystals during pulling-up thereof. Note that Comparative Example 2 exhibited a higher devitrification area ratio of 90 to 100%. FIG. 6 shows a fluctuating state of electric current at this time. In this way, it is seen that Comparative Example 2 was certainly subjected to a flow of electric current, fluctuation of the electric current was considerable due to applying a relatively higher constant voltage.

Figure 2:
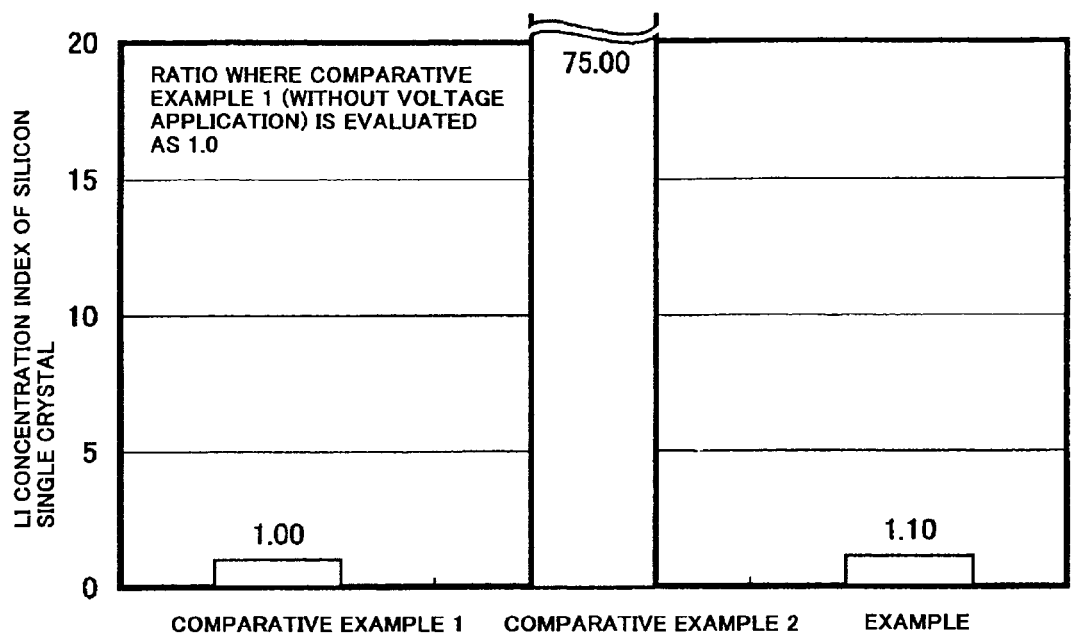
FIG. 2 is a graph of Li concentration of silicon single crystal in Example and Comparative Examples.

FIG. 2 shows a measurement result of Li concentrations of silicon single crystals of Example and Comparative Examples. The Li concentration of each silicon single crystal in Example was notably low as compared to Comparative Example 2, and was only slightly higher than Comparative Example 1 at substantially the same level therewith.

Figure 4:
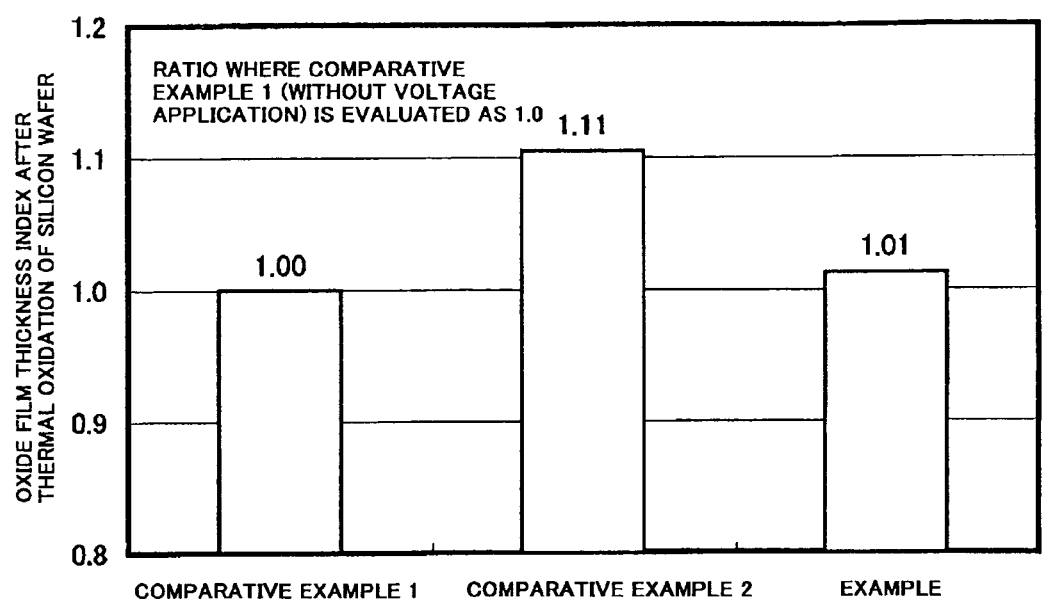
FIG. 4 is a graph of thickness of oxide films provided by a thermal oxidation treatment for wafers sliced out of a silicon single crystal, in Example and Comparative Examples.
Figure 5:
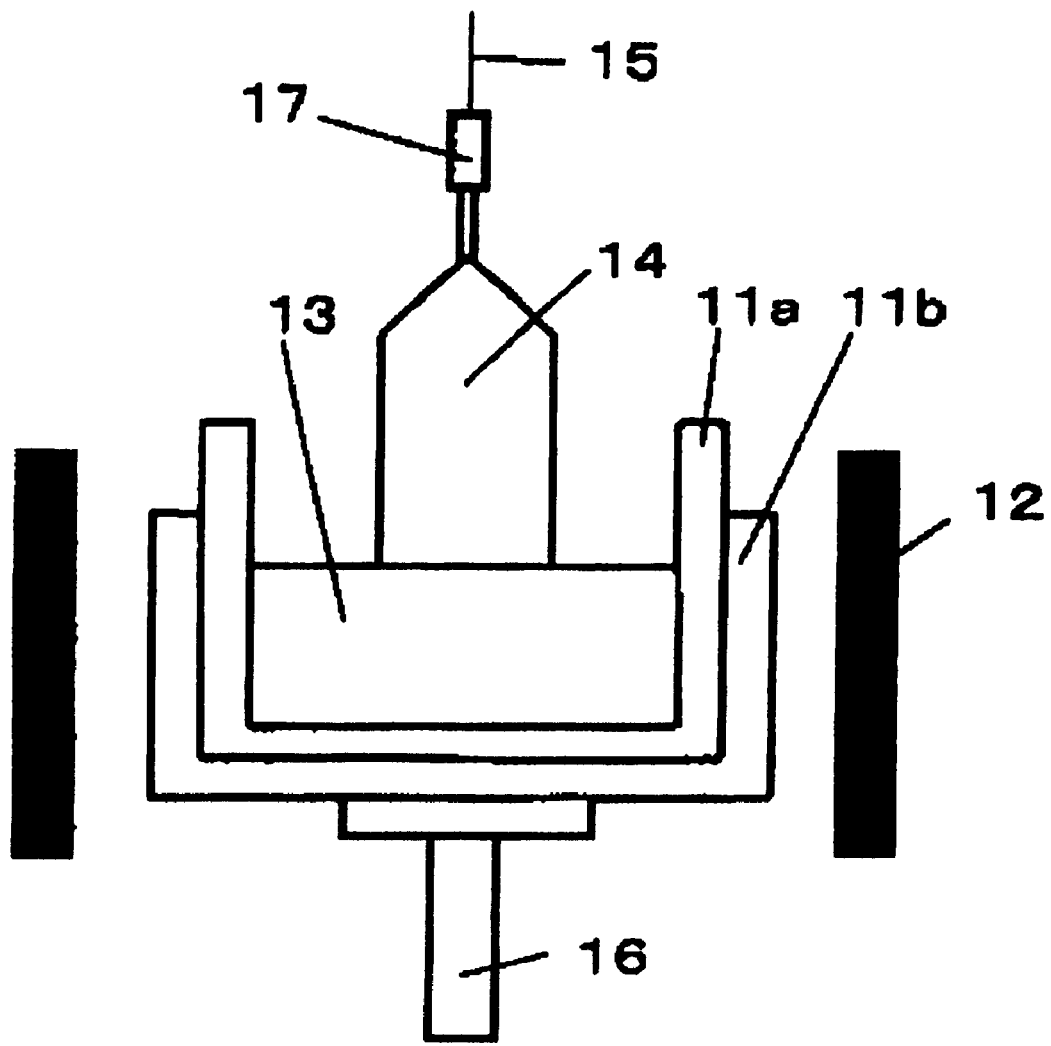
FIG. 5 is a schematic view of an essential constitution of a pulling apparatus adapted to perform a silicon single crystal growth method based on the CZ method.

FIG. 4 shows a measurement result of oxide film thicknesses of wafers sliced out of the silicon single crystals of Example and Comparative Examples after conduction of thermal oxidation treatment thereto. The oxide film thicknesses of silicon wafers in Example were thin as compared with Comparative Example 2, and were at substantially the same level as Comparative Example 1. Moreover, Example exhibited substantially no variances in thickness, considerable variances were found in oxide film thicknesses in Comparative Example 2, wafer by wafer.

From the above, it is made possible, by the silicon single crystal growth method and the pulling apparatus of the present invention, to efficiently devitrify an inner wall surface of a quartz crucible in a silicon single crystal pulling-up process, and to restrict and uniformalize a concentration of Li to be caught into a silicon single crystal.

This enables prevention of generating dislocations in single crystal growth process and improvement of a yield and productivity of single crystal even in a single crystal pulling-up operation over a long time, and enables decrease and variance-restriction of a concentration of Li which exhibits adverse effects upon formation of oxide films, so that the present invention can be widely utilized in a field of production of silicon single crystals for semiconductor devices.

The present invention is not limited to the embodiment described above. The above-described aspects are mere examples and those having substantially the same structure as technical ideas described in the appended claims and providing the similar functions and advantages are included in the scope of the present invention.

The invention claimed is:

1. A silicon single crystal growth method of pulling up and growing a single crystal from a melt of a silicon raw material in a quartz crucible based on a Czochralski method, wherein the method comprises the steps of:
    applying a DC voltage between an outer wall of the quartz crucible acting as a positive electrode and a pulling wire or pulling shaft for pulling up the silicon single crystal acting as a negative electrode; and
    keeping a constant electric current flowing through the silicon single crystal over a period of time for pulling up the single crystal, to grow the single crystal, wherein the constant electric current flowing through the silicon single crystal is set to be constant within a range between 0.1 mA and 15 mA.

2. The silicon single crystal growth method according to claim 1, wherein the quartz crucible is constituted of an outer wall made of natural quartz containing alkali metal ions, and an inner wall made of synthetic quartz having an alkali metal ion content lower than that of the natural quartz.

3. The silicon single crystal growth method according to claim 1, wherein the step of keeping the constant electric current constant comprises a step of setting the electric current at a constant value for providing a devitrification area ratio Vc/Vi of 20% or more during pulling-up of the single crystal, to thereby grow the single crystal silicon, where Vc is an area devitrified at an inner wall surface of the quartz crucible, and Vi is an area which the inner wall surface of the quartz crucible contacts with the melt upon initiation of pulling-up of the single crystal.

4. The silicon single crystal growth method according to claim 2, wherein the step of keeping the constant electric current constant comprises a step of setting the electric current at a constant value for providing a devitrification area ratio Vc/Vi of 20% or more during pulling-up of the single crystal, to thereby grow the single crystal silicon, where Vc is an area devitrified at an inner wall surface of the quartz crucible, and Vi is an area which the inner wall surface of the quartz crucible contacts with the melt upon initiation of pulling-up of the single crystal.

* * * * *